United States Patent [19]

Sander et al.

[11] Patent Number: 4,714,686
[45] Date of Patent: Dec. 22, 1987

[54] METHOD OF FORMING CONTACT PLUGS FOR PLANARIZED INTEGRATED CIRCUITS

[75] Inventors: Craig S. Sander, Cupertino; Balaji Swaminathan, Mountain View, both of Calif.

[73] Assignee: Advanced Micro Devices, Inc., Sunnyvale, Calif.

[21] Appl. No.: 761,206

[22] Filed: Jul. 31, 1985.

[51] Int. Cl.[4] .................. H01L 21/283; H01L 21/308
[52] U.S. Cl. .................................... 437/195; 437/193; 437/186
[58] Field of Search .................. 29/589, 590, 591; 148/1.5, 187, 188, DIG. 50; 357/65; 156/643

[56] References Cited

U.S. PATENT DOCUMENTS

| | | | |
|---|---|---|---|
| 4,209,350 | 6/1980 | Ho et al. | 148/188 |
| 4,256,514 | 3/1981 | Pogge | 148/1.5 |
| 4,369,565 | 1/1983 | Muramatsu | 29/580 |
| 4,404,737 | 9/1983 | Kanzaki et al. | 29/577 C |
| 4,477,310 | 10/1984 | Park et al. | 156/643 |
| 4,502,210 | 3/1985 | Okumura et al. | 29/591 |
| 4,538,344 | 9/1985 | Okumura et al. | 29/589 |
| 4,554,728 | 11/1985 | Shepard | 29/576 W |
| 4,562,640 | 1/1986 | Widmann et al. | 29/591 |
| 4,566,176 | 1/1986 | Moots et al. | 29/578 |

OTHER PUBLICATIONS

Elliot, G., "Integrated Circuit Fabrication Technique", McGraw, Hill, pp. 32–34 TK7874.E5, 1982.
Ghandhi, S. K., "VLSI Principles", John Wiley & Son, 1983, pp. 348–353.

Primary Examiner—Brian E. Hearn
Assistant Examiner—T. N. Quach
Attorney, Agent, or Firm—Patrick T. King; Eugene H. Valet; John P. Taylor

[57] ABSTRACT

A method for forming doped, conductive plugs to fill and planarize contact windows in integrated circuits is disclosed. The process is applicable to CMOS, NMOS and bipolar technologies. Discrete, sized, contact apertures formed superposing junction regions of a substrate are filled with semiconductor material and the semiconductor material is doped to match the conductivity type of the underlying junction regions. Thus, the integrated circuit structure is substantially planarized for formation of interconnect layers.

6 Claims, 8 Drawing Figures

METHOD OF FORMING CONTACT PLUGS FOR PLANARIZED INTEGRATED CIRCUITS

BACKGROUND OF THE INVENTION

1. Field of the Invention

The present invention generally relates to integrated circuit contact structures and, in particular, to a method for forming conductive, or semiconductive, contact plugs for fully planarized integrated circuit devices, particularly those fabricated using complementary metal-oxide-semiconductor (CMOS) processes.

2. Description of the Related Art

The advent of very large scale integrated (VLSI) circuitry in the semiconductor field has created many problems, including the need to effectively interconnect the tens, and even hundreds, of thousands of active components often present on a VLSI circuit die. The standard interconnection mechanism in the current state of the art is basically a patterned thin film of conductive material, e.g., aluminum, deposited upon an insulator layer which has holes (aka contact windows) leading down to the junction region of each active device to be coupled.

In VLSI, the horizontal dimension for component regions on the surface of the wafer is approaching the 1 micron range. Yet, the vertical height, or depth, of contact apertures may not be amenable to this scaling because of constraints such as parasitic capacitance and metal interconnect step coverage. These relatively deep contact holes are not amenable to sputtered metal films used for interconnection. Poor step coverage results in losses in yield and reliability.

One method used to combat this difficulty is to use etching methods which form contact apertures with sloping sidewalls. This can often solve the problem of poor metal step coverage into the contact windows. However, this method does not help achieve shrinkage because the dimension at the top of the contact window remains relatively large.

Current CMOS integrated circuits have contacts to p+ and n+ diffused regions placed well inside of the diffusion area in order to prevent the contact hole from opening over both the p+ or n+ region and the surrounding field isolation region (which would result in an electrical short between the junction and the field, rendering the circuit inoperative). The spacing requirements for aligning the apertures well within the diffusion region is also contrary to the goal of scaling.

A related problem occurs in both NMOS and CMOS VLSI because of the very shallow n+ and p+ junctions commonly used. When contacted directly by metal interconnection layers, such as aluminum or aluminum/1% silicon material, "spiking" of the metal through the junction can occur. This also results in losses in yield and reliability.

SUMMARY OF THE INVENTION

It is a principal object of the present invention to provide a low-resistance, conductive plug for contact apertures used for integrated circuit interconnections.

It is another object of the present invention to provide a method for forming contact aperture plugs for an integrated circuit device.

It is a further object of the present invention to provide a method for forming a conductive, low-resistance filler for integrated circuit contact windows which minimizes the step heights on the wafer to ease the requirements for the deposition and masking of successive layers.

Yet another object of the present invention is to provide a relatively thick layer of material between a metal interconnection layer and the silicon junction regions of an integrated circuit to greatly reduce the possibility of "spiking."

In its broad aspect, the present invention provides a method for forming contact aperture plugs for an integrated circuit device, having a substantially planar dielectric layer disposed upon the surface of the device, said surface having junction regions disposed thereon, by forming contact apertures in said dielectric layer according to a pattern matching said junction regions; forming a layer of material across said surface, filling said apertures; removing said material from said surface while leaving said material in said apertures; and doping said material remaining in said apertures to match the polarity of the junction region over which each has been formed.

The process disclosed provides the advantage of allowing the utilization of planarization techniques prior to the formation of the contact holes, thus providing a smooth surface for the deposition and masking of successive layers.

Another advantage of the present invention is to allow the use of contact holes with vertical sidewalls which are simpler to form and which occupy less wafer real estate.

Other objects, features and advantages of the present invention will become apparent upon consideration of the following detailed description and the accompanying drawings, in which like reference designations represent like features through the FIGURES.

BRIEF DESCRIPTION OF THE DRAWINGS

FIGS. 1 through 6 are cross-sectional schematic drawings of an idealized sequence of process steps according to embodiments of the present invention in which:

FIG. 1 shows step completion of a substrate having a contact aperture through a planarized dielectric layer;

FIG. 2 shows step completion in which a polysilicon layer overlays the dielectric layer and fills the contact aperture of FIG. 1;

FIG. 3 shows step completion in which the polysilicon layer of FIG. 2 has been stripped, leaving a polysilicon plug in the contact aperture;

FIG. 6 shows step completion of the present invention with an overlying metal layer in place.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described and set forth in the accompanying drawings. The drawings referred to in this description should be understood not to be drawn to scale except where specifically noted. Moreover, the drawings are intended to illustrate only one portion of an integrated circuit fabricated in accordance with the present invention.

Figure 1:
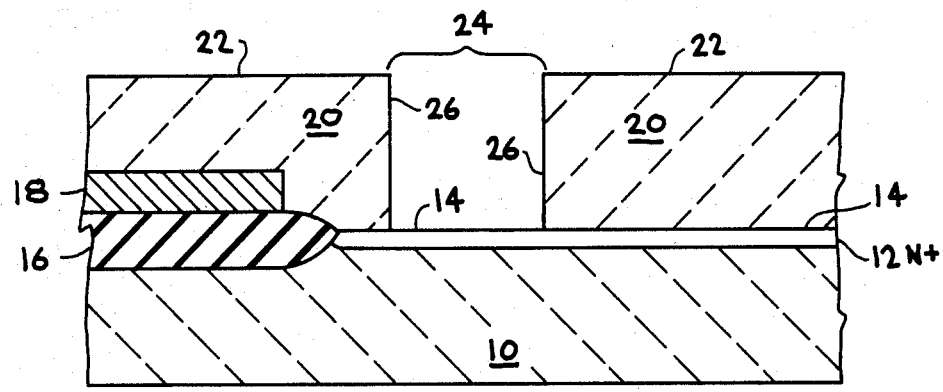

FIG. 1 shows a wafer substrate 10, for example of a p-type conductivity, generally formed of crystalline silicon, or an epitaxially formed silicon layer, in and on which active integrated circuit components have been fabricated. For illustration purposes, a diffusion region 12 being heavily doped to have an n+ conductivity type lies just below the surface 14 of substrate 10. This diffusion region 12 is isolated from any adjacent, doped region of the surface 14 by a field oxide region 16 and the p-type substrate 10. An exemplary polysilicon gate 18 is shown superposing the field oxide 16.

Many publications describe the details of common techniques used in the fabrication process of integrated circuit components. See, for example, *Semiconductor & Integrated Circuit Fabrication Techniques*, Reston Publishing Co., Inc., copyright 1979 by the Fairchild Corporation; and Ghandhi, *VLSI Fabrication Principles*, J. Wiley & Sons, Inc., copyright 1983. Those techniques are employed in the practice of the present invention. Moreover, individual steps can be performed using commercially available integrated circuit fabrication machines. As specifically necessary to an understanding of the present invention, approximate technical data are supplied herein based upon current technology. Future developments in this art may call for appropriate adjustments as would be obvious to one skilled in the art.

When fabrication of the active components is complete, an extremely planar dielectric layer 20 is formed on the surface of the die. A technique such as that described by Adams and Capio, *J. Electrochem, Soc.*, Vol. 128 (1981), pp. 432-37, may be employed. Basically, a layer of silicon dioxide (approximately 1.0 micron thick) is deposited by chemical vapor deposition (CVD). A film of photoresist (also approximately 1.0 micron) is spun onto the surface. The flat surface of the photoresist film is transferred to the silicon dioxide layer 20 by etching 1.3 microns of material in a plasma under conditions such that the photoresist and oxide etch at the same approximate rate. After stripping any residual resist, another 0.5 micron of silicon dioxide is deposited.

A contact aperture pattern is then defined on the surface 22 of the dielectric layer 20 using conventional photomasking techniques. The aperture pattern mask (not shown) is designed so all apertures 24 are 1.4 microns or less in one horizontal dimension. There is no restriction on the other horizontal dimension and the vertical dimension can vary between 0.5 and 2.5 microns for most practical considerations. Apertures 24 are etched into the dielectric layer 20, such as by using conventional anisotropic plasma oxide etching techniques. This will form contact apertures 24 having sidewalls 26 which are substantially vertical (i.e., perpendicular to the wafer surface 14). The photoresist mask is then stripped.

Figure 2:
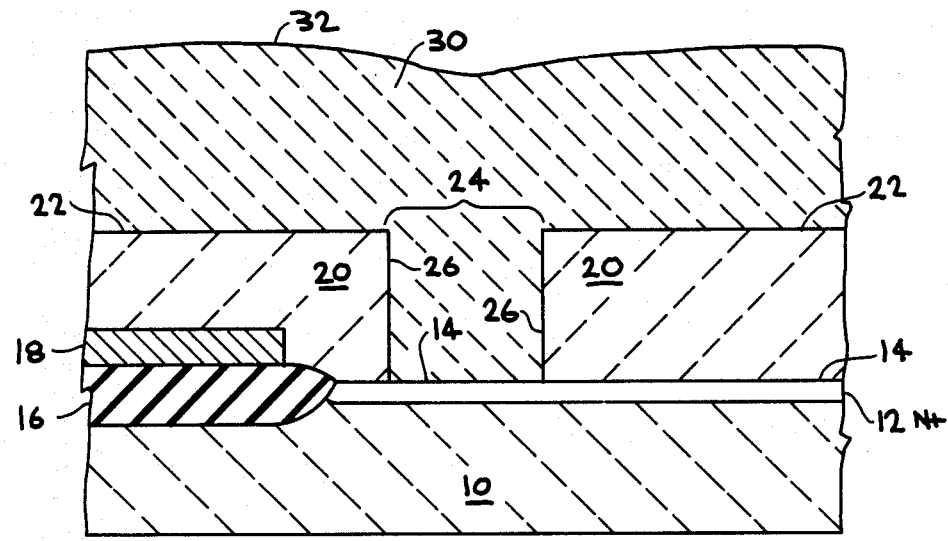

Next, as shown in completion in FIG. 2, a semiconductive material layer 30 is formed. Generally, CVD is used to obtain a polysilicon layer 30 which is approximately 1.5 microns thick. Because of the small dimension of the contact apertures 24 in at least one spatial extent and the conformal nature of the chemical vapor deposition, the surface 32 of the polysilicon will be substantially planar.

Figure 3:
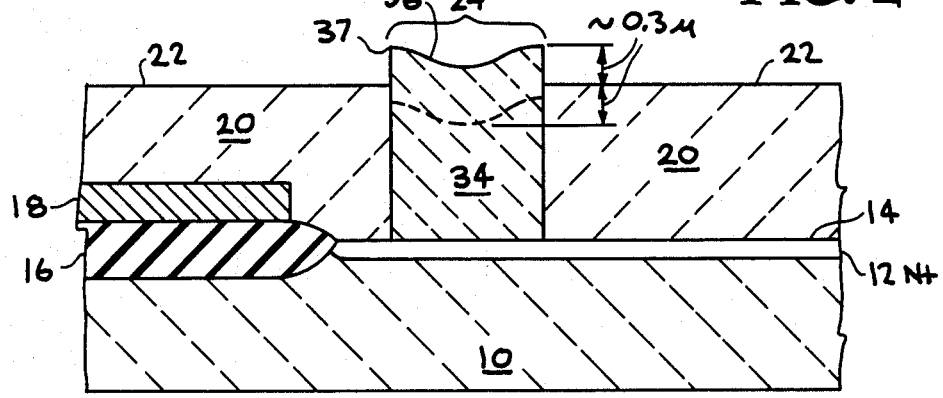

The polysilicon layer 30 is then etched back until the surface 22 of the dielectric 20 is exposed, preferably using an etch process with an end-point detection, leaving polysilicon aperture plugs 34 in each of the apertures 24, as shown in completion in FIG. 3. This etch step is allowed to continue until all polysilicon in areas other than the contact apertures 24 is removed from the surface 22 of the dielectric layer 20.

The process used for the etch back of polysilicon layer 30 is preferably performed in a plasma using gasses and process conditions which cause the polysilicon layer 30 to etch at approximately the same rate as the underlying dielectric layer 20. Slight differences in the etch rates of the polysilicon layer 30 and the dielectric layer 20 will cause variations in the vertical position of the perimeter surfaces 36 of the poly plug 34 relative to the position of the surface 22 of the dielectric layer 20. Typical etch processes will cause the perimeter surfaces 37 of the poly plug 34 to be either above or below the surface 22 of the dielectric layer 20 by between 0 and 0.3 microns. Thus, the maximum step height into or out of the contact windows 24 which must be covered by the successive metal interconnection layer 40 is 0.3 microns.

Figure 4A:
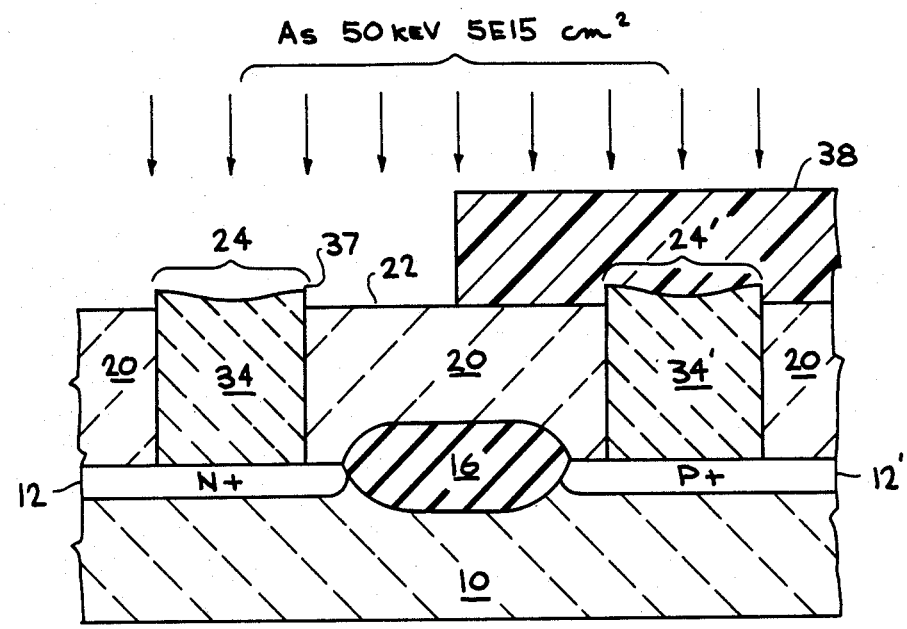
FIGS. 4a and 4b show the doping of the contact plugs as shown in FIG. 3.
Figure 4B:
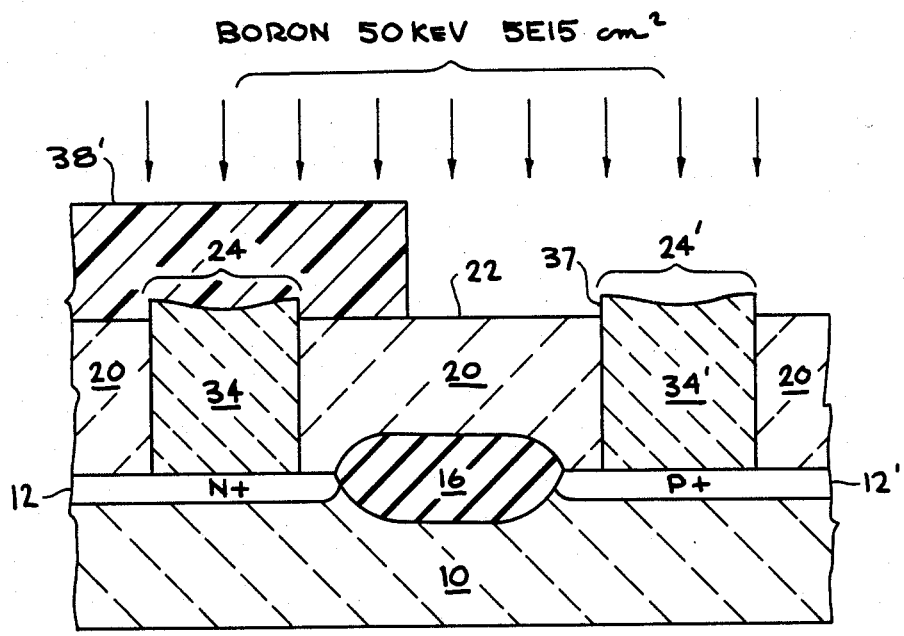

As shown in FIGS. 4a and 4b, the polysilicon plugs 34, 34' are then doped either n+ or p+ to match the doping polarity of the junction regions 12, 12' over which each has been formed. Referring to FIG. 4a, a mask 38 (typically photoresist) is patterned such that it covers the p+ junction windows 24' having previously formed polysilicon aperture plugs 34'. The plugs 34 within the apertures 24 superposing the n+ junction regions 12 of the substrate 10 are doped, such as by conventional ion implantation. The arrows in FIG. 4a represent an exemplary implant dose which is approximately $5 \times 10^{15}$ cm$^{-2}$ at an energy of 50 keV using arsenic or phosphorus ions. Mask 38 is then removed.

Another mask 38' (again, typically photoresist) is formed to cover the n+ junction windows 24 having the now n+ doped aperture plugs 34 as shown in FIG. 4b. The unmasked aperture plugs 34' within the apertures 24' superposing the p+ junction regions 12 are doped, again such as by conventional ion implantation techniques. The arrows in FIG. 4b represent a boron (or BF$_2$) ion implant dose which is approximately the same as the dosage used for the n+ doping of aperture plugs 34. The photoresist mask 38' is then removed.

The dopants can be diffused through the plugs 34, 34' by a heat treatment—approximately one hour at 900° C. in an argon atmosphere.

Figure 5A:
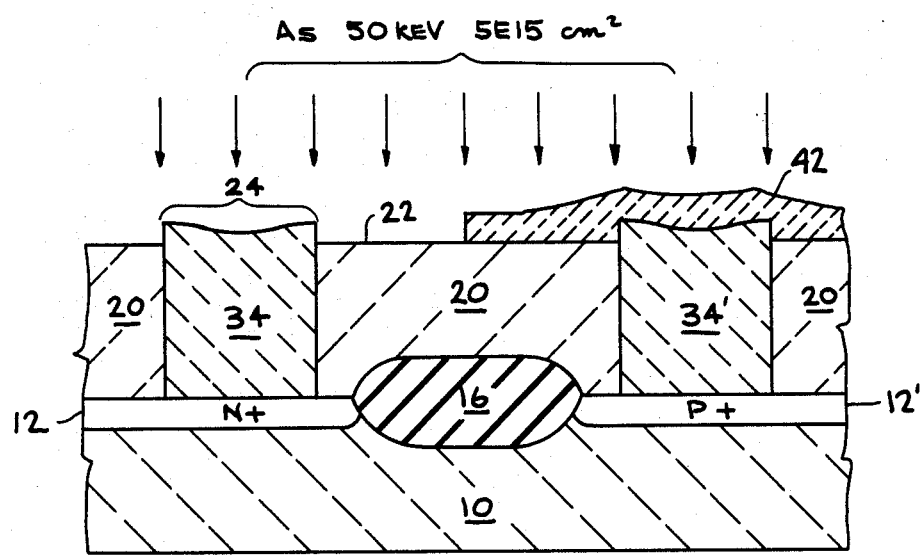
FIGS. 5a and 5b show an alternative process for doping the contact plugs as shown in FIG. 3.
Figure 5B:
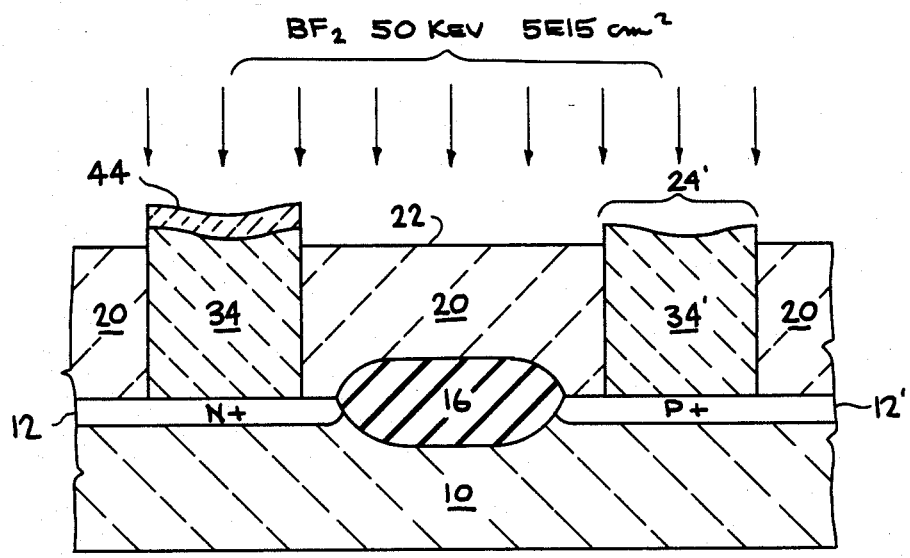

An alternative procedure for doping the plugs 34, 34' is shown in FIGS. 5a and 5b. First, a silicon nitride layer 42 is formed to cover plugs 34' superposing p+ junction regions 12'. After an n+ implant (as discussed in re FIG. 4a), the n+ doped plugs 34 are oxidized on their top surface, such as by a conventional thermal growth process, to form an oxide layer 44 as shown in FIG. 5b. The nitride layer 42 is then stripped to expose the plugs 34' which superpose the p+ junction regions 12'. The oxide layer 44 is formed over the n+ plugs 34 to a thickness which is sufficient to block the subsequent p+ dopant implant. The p+ and n+ dopants again are diffused through the plugs by heat treatment—such as at approximately 900° C. in argon for approximately one hour.

Following the doping of the p+ plugs 34' (as discussed in re FIG. 4b), the oxide layers 44 are removed by commonly known techniques such as a wet chemical etch or a plasma etch process.

Figure 6:
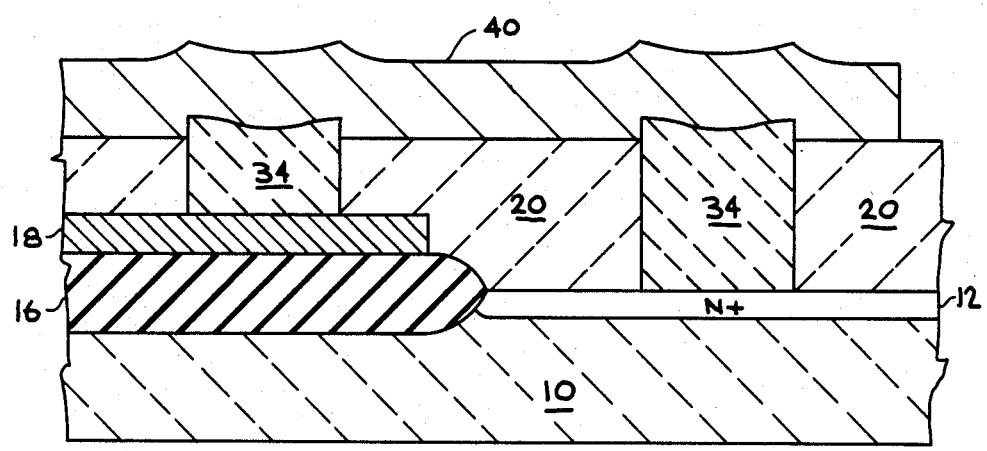

With the processing of the polysilicon aperture plugs 34, 34' completed, the die can be processed conventionally, starting with the deposition of the metal interconnection layers 40 such as shown in step completion in FIG. 6.

The present invention has been demonstrated in a CMOS process mode. It will be obvious to one skilled in the art that simple modifications make it applicable to NMOS and bipolar integrated circuit fabrication processes. For example, for an NMOS application, no photomasking steps are necessary before the n+ implantation step and no p+ implant is necessary.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in the art. Similarly, the process steps described may be performed in a different order to achieve the same result. The embodiment was chosen and described in order to best explain the principles of the invention and its practical application, to thereby enable others skilled in the art to best understand the invention for various embodiments and with various modifications as are suited to the particular use contemplated. It is intended that the scope of the invention be defined by the claims appended hereto and their equivalents.

What is claimed is:

1. An improved method for forming conductive plugs in contact windows in a dielectric layer overlying junction regions in an integrated circuit structure comprising:
   (a) forming contact windows in said dielectric layer in a pattern conforming to said junction regions;
   (b) forming a layer of polysilicon on said dielectric layer to fill said contact windows;
   (c) performing an etching process which etches said polysilicon filler material and said dielectric layer at approximately the same rate, such that all said filler material is removed from the surface of said dielectric layer, leaving said filler material only in said windows such that the perimeter surface of said window filler material extends above or below the surface of said dielectric layer by approximately no more than 0.3 microns;
   (d) forming a first masking layer over said plugs in windows overlying junction regions having a first conductivity type;
   (e) doping, with a second conductivity type dopant, the plugs in windows overlying junction regions having said second conductivity type;
   (f) removing said first masking layer;
   (g) forming a second masking layer over said plugs doped with said second conductivity type dopant;
   (h) doping, with a first conductivity type dopant, the plugs in windows overlying junction regions having said first conductivity type; and
   (i) removing said second masking layer; whereby each window has a plug therein having a conductivity type matching the underlying junction region.

2. An improved method for forming conductive plugs in contact windows in a dielectric layer overlying junction regions in an integrated circuit structure comprising:
   (a) forming contact windows in said dielectric layer in a pattern conforming to said junction regions;
   (b) forming a layer of polysilicon on said dielectric layer to fill said contact windows;
   (c) performing an etching process which etches said polysilicon filler material at a greater rate than said dielectric layer, such that said polysilicon plug is recessed below the surface of said dielectric layer to a depth of approximately no more than 0.3 microns;
   (d) forming a first masking layer over said plugs in windows overlying junction regions having a first conductivity type;
   (e) doping, with a second conductivity type dopant, the plugs in windows overlying junction regions having said second conductivity type;
   (f) removing said first masking layer;
   (g) forming a second masking layer over said plugs doped with said second conductivity type dopant;
   (h) doping, with a first conductivity type dopant, the plugs in windows overlying junction regions having said first conductivity type; and
   (i) removing said second masking layer;
   whereby each window has a plug therein having a conductivity type matching the underlying junction region.

3. An improved method for forming conductive plugs in contact windows in a dielectric layer overlying junction regions in an integrated circuit structure comprising:
   (a) forming contact windows in said dielectric layer in a pattern conforming to said junction regions;
   (b) forming a layer of polysilicon on said dielectric layer to fill said contact windows;
   (c) performing an etching process which uses an endpoint detection such that detection occurs when said polysilicon filler material has been removed from said dielectric layer;
   (d) forming a first masking layer over said plugs in windows overlying junction regions having a first conductivity type;
   (e) doping, with a second conductivity type dopant, the plugs in windows overlying junction regions having said second conductivity type;
   (f) removing said first masking layer;
   (g) forming a second masking layer over said plugs doped with said second conductivity type dopant;
   (h) doping, with a first conductivity type dopant, the plugs in windows overlying junction regions having said first conductivity type; and
   (i) removing said second masking layer;
   whereby each window has a plug therein having a conductivity type matching the underlying junction region.

4. An improved method for forming conductive plugs in contact windows in a dielectric layer overlying junction regions in an integrated circuit structure comprising:
   (a) forming contact windows in said dielectric layer in a pattern conforming to said junction regions;
   (b) forming a layer of polysilicon on said dielectric layer to fill said contact windows;
   (c) performing an etching process which etches said polysilicon filler material and said dielectric layer at approximately the same rate, such that all said filler material is removed from the surface of said dielectric layer, leaving said filler material only in said windows such that the perimeter surface of said window filler material extends above or below the surface of said dielectric layer by approximately no more than 0.3 microns;
   (d) forming a first silicon nitride masking layer over said structure including plugs in windows overlying junction regions having a first conductivity type with openings in said mask exposing plugs in windows overlying junction regions regions having said second conductivity type;

(e) doping, with a second conductivity type dopant, said plugs in windows overlying junction regions having said second conductivity type;

(f) forming a second mask over said plugs doped with said second conductivity type dopant by forming, as a second mask, an oxide layer on the top surface of said doped plugs;

(g) removing said first silicon nitride masking layer;

(h) doping, with a first conductivity type dopant, the plugs in windows overlying junction regions having said first conductivity type; and (i) removing said second oxide mask layer;

whereby each window has a plug therein having a conductivity type matching the underlying junction region.

5. An improved method for forming conductive plugs in contact windows in a dielectric layer overlying junction regions in an integrated circuit structure comprising:

(a) forming contact windows in said dielectric layer in a pattern conforming to said junction regions;

(b) forming a layer of polysilicon on said dielectric layer to fill said contact windows;

(c) performing an etching process which etches said polysilicon filler material at a greater rate than said dielectric layer, such that said polysilicon plug is recessed below the surface of said dielectric layer to a depth of approximately no more than 0.3 microns;

(d) forming a first silicon nitride masking layer over said structure including plugs in windows overlying junction regions having a first conductivity type with openings in said mask exposing plugs in windows overlying junction regions regions having said second conductivity type;

(e) doping, with a second conductivity type dopant, said plugs in windows overlying junction regions having said second conductivity type;

(f) forming a second mask over said plugs doped with said second conductivity type dopant by forming, as a second mask, an oxide layer on the top surface of said doped plugs;

(g) removing said first silicon nitride masking layer;

(h) doping, with a first conductivity type dopant, the plugs in windows overlying junction regions having said first conductivity type; and (i) removing said second oxide mask layer;

whereby each window has a plug therein having a conductivity type matching the underlying junction region.

6. An improved method for forming conductive plugs in contact windows in a dielectric layer overlying junction regions in an integrated circuit structure comprising:

(a) forming contact windows in said dielectric layer in a pattern conforming to said junction regions;

(b) forming a layer of polysilicon on said dielectric layer to fill said contact windows;

(c) performing an etching process which uses an endpoint detection such that detection occurs when said polysilicon filler material has been removed from said dielectric layer;

(d) forming a first silicon nitride masking layer over said structure including plugs in windows overlying junction regions having a first conductivity type with openings in said mask exposing plugs in windows overlying junction regions having said second conductivity type;

(e) doping, with a second conductivity type dopant, said plugs in windows overlying junction regions having said second conductivity type;

(f) forming a second masking layer over said plugs doped with said second conductivity type dopant by forming an oxide layer on the top surface of said doped plugs;

(g) removing said first silicon nitride masking layer;

(h) doping, with a first conductivity type dopant, the plugs in windows overlying junction regions having said first conductivity type; and (i) removing said second oxide masking layer;

whereby each window has a plug therein having a conductivity type matching the underlying junction region.

* * * * *